United States Patent [19]

Wu et al.

[11] Patent Number: 5,612,235

[45] Date of Patent: Mar. 18, 1997

[54] METHOD OF MAKING THIN FILM TRANSISTOR WITH LIGHT-ABSORBING LAYER

[75] Inventors: Meng-Yueh Wu; Tzung-Szu Weng, both of Taipei, Taiwan

[73] Assignee: Industrial Technology Research Institute, Hsinchu, Taiwan

[21] Appl. No.: 551,727

[22] Filed: Nov. 1, 1995

[51] Int. Cl.$^6$ .................................................. H01L 21/84
[52] U.S. Cl. .................................................. 437/41; 437/174
[58] Field of Search ................................. 437/40–41, 101, 437/909, 174

[56] References Cited

U.S. PATENT DOCUMENTS

| | | | |
|---|---|---|---|
| 5,130,263 | 7/1992 | Possin et al. | 437/40 |
| 5,371,025 | 12/1994 | Sung | 437/41 |
| 5,371,398 | 12/1994 | Nishihara | 257/435 |
| 5,409,851 | 4/1995 | Oh | 437/41 |
| 5,427,962 | 6/1995 | Sasaki et al. | 437/41 |
| 5,534,716 | 7/1996 | Takemura | 257/72 |

FOREIGN PATENT DOCUMENTS 2-20832A  1/1990  Japan .
5-203977A  8/1993  Japan .

*Primary Examiner*—John Niebling
*Assistant Examiner*—Richard A. Booth
*Attorney, Agent, or Firm*—George O. Saile; Stephen B. Ackerman

[57] ABSTRACT

A self-aligned polysilicon thin film transistor, and a method for manufacturing it, is descrbed. An insulating substrate is provided. A gate electrode is formed on the insulating substrate. A protective light-absorbing layer is formed over the gate electrode and over the insulating substrate. The protective light-absorbing layer is patterned. A gate dielectric layer is formed over the protective light-absorbing layer and over the insulating substrate. A layer of amorphous silicon is formed over the gate dielectric layer. A photoresist mask is formed over the layer of amorphous silicon, aligned with the protective light-absorbing layer. The amorphous silicon layer is implanted with a conductivity-imparting dopant in source/drain regions not protected by the photoresist mask. The photoresist mask is removed. The amorphous silicon layer is laser-annealed, whereby doped polysilicon is formed in the source/drain regions, and undoped polysilicon is formed in areas between the source/drain regions. Source and drain electrodes of electrically conductive material are formed in contact with the source/drain regions.

13 Claims, 6 Drawing Sheets

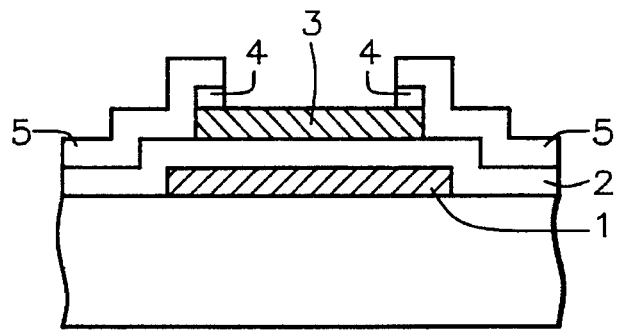
FIG. 1 – Prior Art
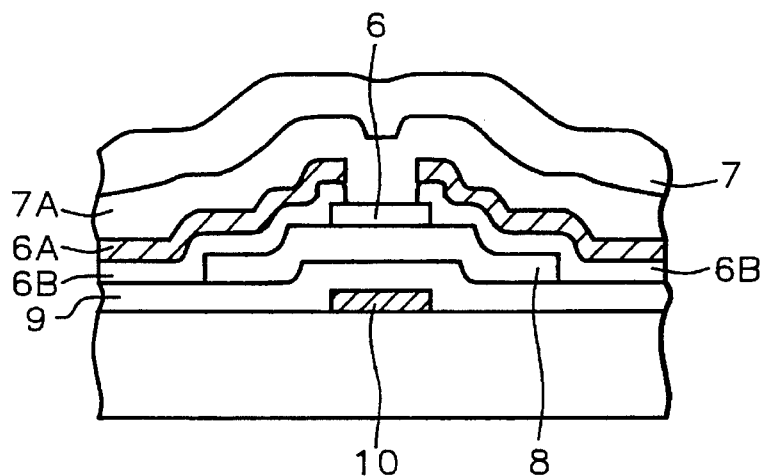
FIG. 2 – Prior Art
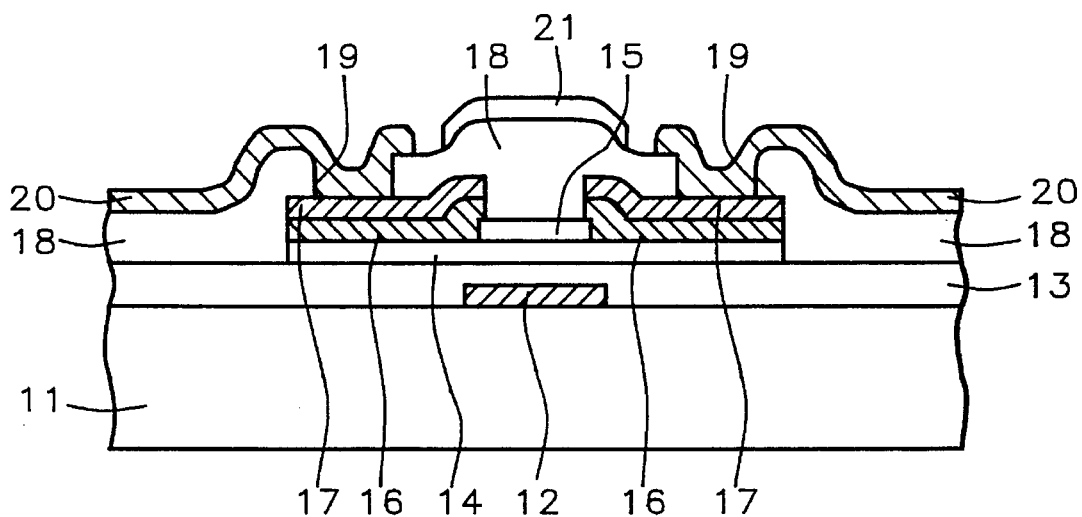
FIG. 3 – Prior Art

METHOD OF MAKING THIN FILM TRANSISTOR WITH LIGHT-ABSORBING LAYER

BACKGROUND OF THE INVENTION (1) Field of the Invention

The invention relates to a a thin film transistor for use in conjunction with an active matrix liquid crystal display or the like, and more particularly to a method of manufacturing a thin film transistor in which a light-absorbing layer is added so that a laser can be safely used to irradiate and recrystallize the conductive layer of the transistor. The conductive layer is changed from amorphous silicon into polysilicon after the laser anneal.

(2) Background Art

In order to reduce both the cost and size of active matrix liquid crystal displays (LCD), the LCD driver circuits need to be integrated onto the glass substrate on which the LCD in formed. Polysilicon (poly-si) thin film transistor (TFT) driver circuits manufactured using low-pressure chemical vapor deposition (LPCVD) have been successfully applied in small-size liquid crystal displays. However, LPCVD is a high-temperature process, usually in excess of 600° C., and requires the use of a high-cost quartz substrate. Since amorphous silicon (a-Si) thin film transistors can be grown on low-cost glass substrates at lower temperatures, usually below 300° C., through plasma-enhanced chemical vapor deposition, and since they have a low off current and a high on current/off current ratio, a-si TFT's have been widely used as switching elements in large-area liquid crystal displays currently in mass production. However, it is difficult to use a-Si thin film transistors in the LCD driver circuits, due to a-Si's low mobility, which is less than 1 $cm^2/V \cdot sec$.

As an alternative to using LPCVD, poly-Si TFTs can also be manufactured through the use of low-temperature laser recrystallization. However, due to their high off current and uniformity problems, poly-Si transistors are not sufficient for use as a pixel-switching element. In the interests of the production of low-cost active matrix liquid crystal displays, it would be advantageous to combine the merits of a-Si thin film transistors and laser-annealed poly-Si thin film transistors. One method is to use an a-Si thin film transistor as the switching element and laser-annealed poly-Si thin film transistors in the peripheral driver circuit.

A-Si TFTs are often manufactured using the inverted staggered structure, as shown in FIG. 1. There is shown a gate metal 1, a gate dielectric 2, intrinsic a-Si 3, an n+ a-Si layer 4, and source and drain electrodes 5.

FIG. 2 shows one of the alternatives to the common inverted staggered structure a-Si thin film transistor design, modified to be able to be used in the LCD peripheral driver circuit. The gate electrode 10 and the gate dielectric layer 9 are formed under the a-Si layer 8. Above the a-Si layer 8, a layer of silicon nitride (SiNx) 6 is commonly used as an etching stopper to prevent damage to a-Si layer 8 during etching of the a-si layer 6B to form the TFT source and drain. Source/drain metal contacts 6A are formed over a-si layer 6B. An insulating layer 7A formed of silicon nitride is formed over the source/drain metal contacts 6A.

Since a-Si is a photo-sensitive material, a layer of black resin 7, used to absorb incident light, is formed over layer 7A. However, with the high intensities of incident light experienced when this type of transistor is used to drive an image sensor, this layer cannot completely prevent the transmission of light through to the semiconductor layer 8. Because the semiconductor layer 8 is made of a-Si, a photo-sensitive material, the photo-leakage current of this layer will be increased when it is irradiated. The resultant photo-leakage current causes the transistor to become unstable.

U.S. Pat. No. 5,371,398 to Y. Nichihara discloses a method of manufacturing a thin film transistor, with the resultant structure shown in FIG. 3, comprising a substrate 11, a gate electrode 12, a gate insulating film 13, a first a-Si layer 14, a protecting film 15, a second a-Si layer 16, a diffusion preventing layer 17, an insulating layer 18 having apertures 19 above the diffusion-preventing layer 17, source and drain electrodes 20 connected to the diffusion preventing layer 17 through the apertures 19, and a light-intercepting layer 21. The structure substitutes a metal layer 21 for the black resin 7 of the FIG. 2 structure, in order to reduce the incidence of light on the semiconductor layer 14. However, the a-Si semiconductor layer is still susceptible to photo-leakage current when the transistor is used for an image sensor. In addition, as previously mentioned, the low mobility of a-Si causes difficulty in use in an active matrix LCD driver circuit.

SUMMARY OF THE INVENTION

It is therefore an object of the present invention to provide a thin film transistor which can be used in an active matrix liquid crystal display, or in other applications, such as image-sensing, while solving the above mentioned problems of the prior art.

It is a further object of the present invention to provide a very manufacturable process, and a minimal number of processing steps, for producing such a transistor.

Accordingly, the present invention uses a method for manufacturing a thin film transistor such that a laser may be used to irradiate and recrystallize the semiconductive layer, in order to change the layer from a-Si to poly-Si. The amount of photo-leakage current from poly-Si is insignificant compared to that from a-Si, due to the very low light absorption coefficient of poly-si, so the possibility for photo-leakage current is eliminated.

In accordance with the present invention, there is provided a method of manufacturing a self-aligned polysilicon thin film transistor, in which an insulating substrate is provided. A gate electrode is formed on the insulating substrate. A protective light-absorbing layer is formed over the gate electrode and over the insulating substrate. The protective light-absorbing layer is patterned. A gate dielectric layer is formed over the protective light-absorbing layer and over the insulating substrate. A layer of amorphous silicon is formed over the gate dielectric layer. A photoresist mask is formed over the layer of amorphous silicon, aligned with the protective light-absorbing layer. The amorphous silicon layer is implanted with a conductivity-imparting dopant in source/drain regions not protected by the photoresist mask. The photoresist mask is removed. The amorphous silicon layer is laser-annealed, whereby doped polysilicon is formed in the source/drain regions, and undoped polysilicon is formed in areas between the source/drain regions. Source and drain electrodes of electrically conductive material are formed in contact with the source/drain regions.

When the laser is used to anneal the a-Si layer, most of the energy is absorbed in the a-Si layer to transform it into polysilicon. However, some fraction of this energy can penetrate the a-Si layer to be reflected by the gate electrode. Without a protective layer, this reflected energy can damage the gate oxide, resulting in a thin film transistor with a damaged gate dielectric layer and a high gate leakage current.

The damage to the gate dielectric would be reduced if the laser energy were lowered. however, decreased laser energy would also decrease the effectiveness of the annealing process. With a higher laser energy, the annealing process would be more effective, but with a corresponding increase in the likelihood of damage to the gate dielectric layer, increasing the chance of gate leakage current. FIG. 4 shows the I–V curve of a poly-Si thin film transistor wherein the gate dielectric layer was not seriously damaged. Curves 22 and 23 represent the drain current at $V_d$=5 V and $V_d$=0.1V, respectively. Curves 24 and 25 represent the gate current at $V_d$=5 V and $V_d$=0.1 V, respectively. FIG. 5 shows the I–V curve of a poly-Si thin film transistor wherein the gate dielectric layer has been damaged. The gate leakage current 26 for this transistor is so high as to affect the drain conductive current 27 at a small drain voltage ($V_d$=0.1 V). The drain off current, 28, is high because most of the current flows into the gate electrode, making this transistor unsuitable for switching use due to its inability to turn off. To sidestep the tradeoff between damage to the gate dielectric layer and efficiency of the annealing process, this invention adds a light-absorbing layer over the gate electrode and under the gate dielectric layer. Laser energy penetrating the a-Si layer is thus absorbed in this layer, preventing damage to the gate dielectric.

FIGS. 6 through 9 show the effect of the presence or absence of a light-absorbing layer on the gate leakage current $I_g$ for the transistor. FIG. 6 shows the $I_d$, $I_g$ $V_g$ $V_d$ curve for a transistor which does not include a light-absorbing layer and which was exposed to a single incidence of laser emission at an energy density of 600 mJ/cm.$^2$ (milli-joules per centimeter squared). In this case, the gate dielectric was damaged, resulting in high gate leakage, causing a high drain off current 28 in negative drain bias and making this transistor unsuitable as a switch. FIG. 7 shows the $I_d$, $I_g$ $V_g$ $V_d$ curve for a transistor which includes a light-absorbing layer and which was also exposed to a single incidence of laser emission at an energy density of 600 mJ/cm$^2$.

FIGS. 8 and 9 show corresponding curves for transistors which include light-absorbing layers and which were exposed for four and eight emissions respectively. It is clear that the light-absorbing layer has decreased the gate leakage current. Even with eight emissions, $I_g$ is only about 206 pA (pico amps) at $V_g$=20 V and is only a few pico amps when the transistor is exposed to only one emission. Because the currently-available photo-mask of the a-Si island is used to define the light-absorbing layer, $I_d$ increases with gate voltage with a negative gate bias (FIGS. 7 to 9). A large overlap area between the light-absorbing layer and the drain electrode would generate electron-hole pairs, resulting in the increase of the drain current $I_d$. With a light-absorbing layer of suitable size, a reduction in the overlap (FIGS. 12 and 13), or the use of an offset structure (FIG. 14), $I_{off}$ would be even lower. Thus, driver circuits can be fabricated by laser-annealing a-Si into poly-Si thin film transistors, with the same inverted staggered structure used in each a-Si thin film transistor pixel of the active matrix liquid-crystal display array.

BRIEF DESCRIPTION OF THE DRAWINGS

FIG. 1 is a cross-sectional representation of a Prior Art a-Si thin film transistor with an inverted staggered structure.

FIG. 2 is a cross-sectional representation of a Prior Art a-Si thin film transistor having an extended n+ layer, an additional SiNx layer, and a black resin coating for incident light absorption.

FIG. 3 is a cross-sectional representation of a Prior Art a-Si thin film transistor in which a metal layer is used for light-shielding.

DESCRIPTION OF THE PREFERRED EMBODIMENTS

Hereinafter, a method of manufacturing the present invention is described in detail, with references to the drawings.

Figure 4:
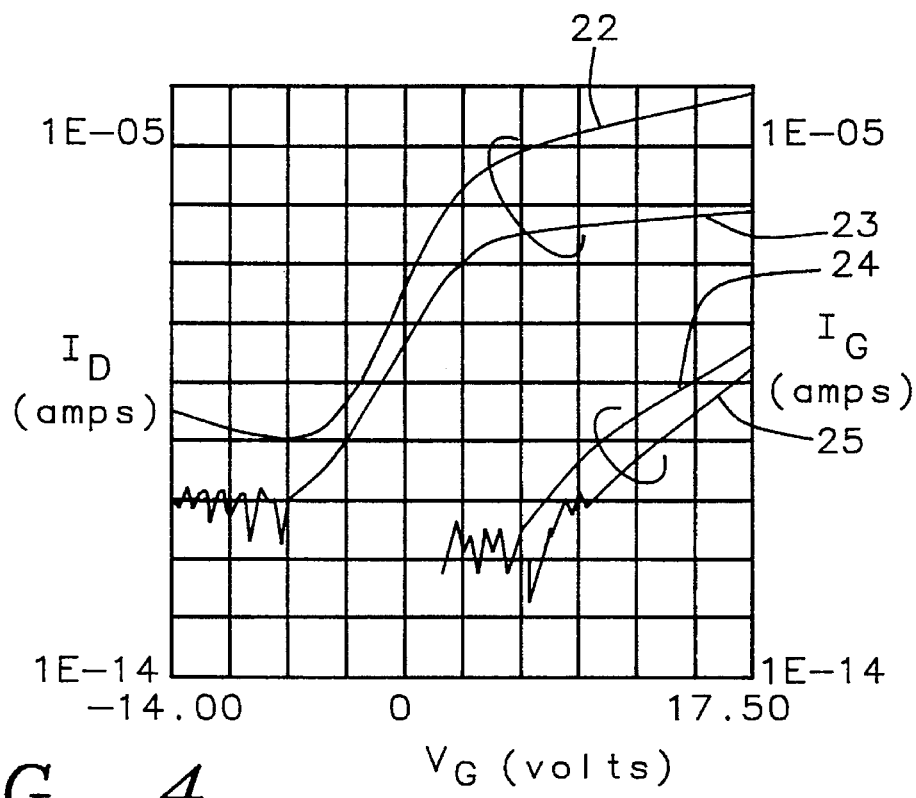
FIG. 4 is a graphical representation of an I–V curve of a poly-Si thin film transistor wherein the gate dielectric layer was not seriously damaged.
Figure 5:
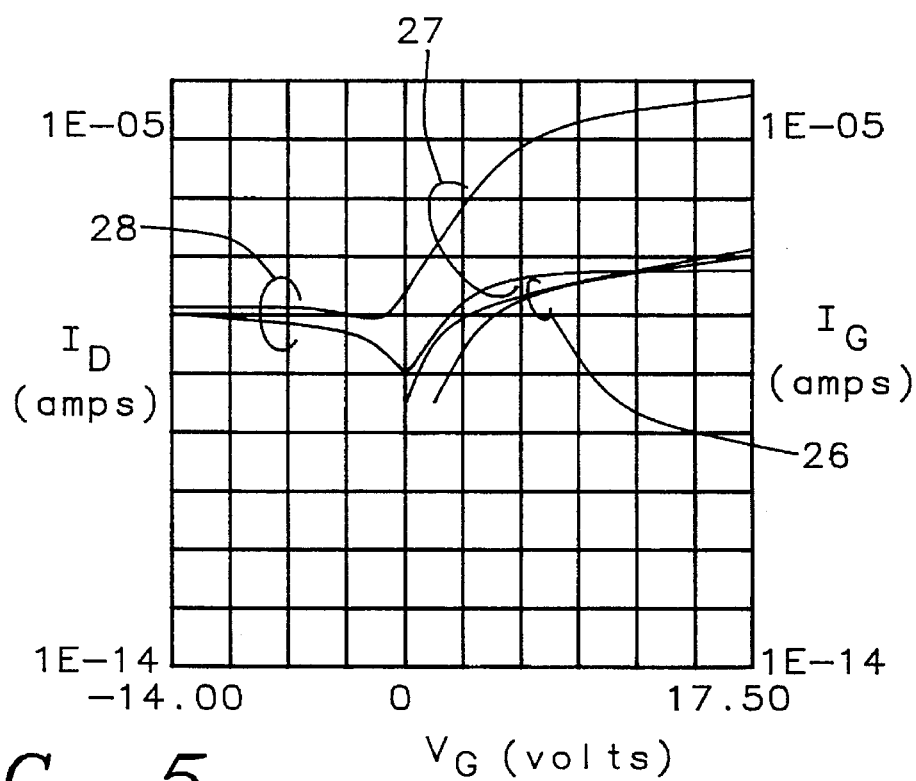
FIG. 5 is a graphical representation of an I–V curve of a poly-Si thin film transistor wherein the gate dielectric layer has been damaged.
Figure 6:
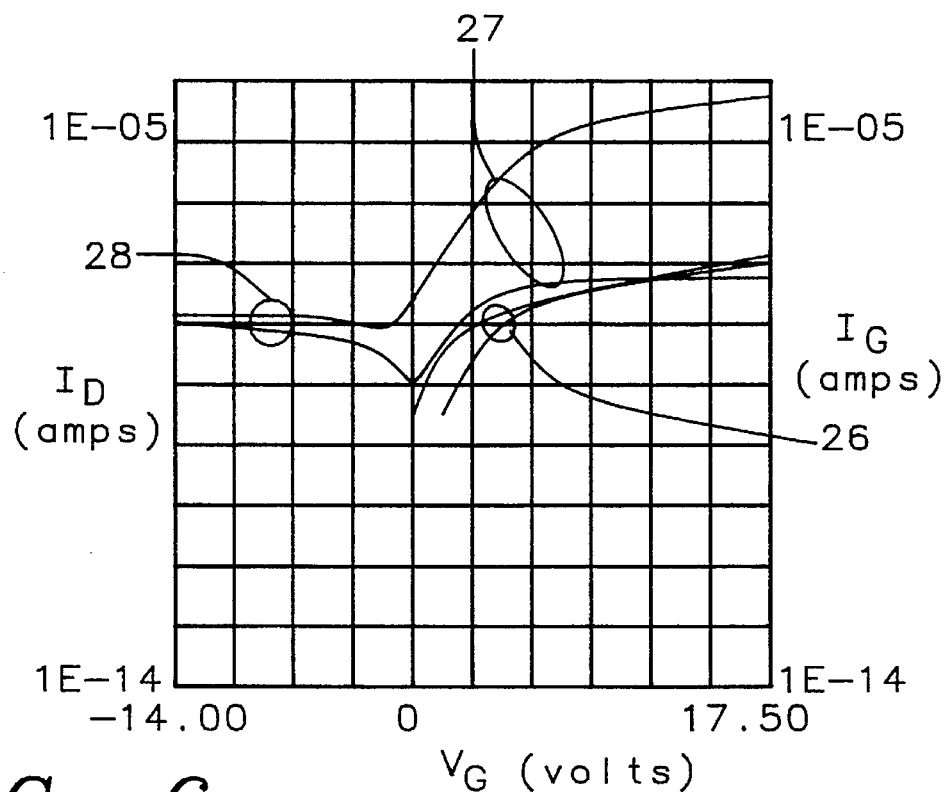
FIG. 6 is a graphical representation of an $I_d$, $I_g$ $V_g$ $V_d$ curve for a transistor which does not include a light-absorbing layer and which was exposed to a single incidence of laser emission.
Figure 7:
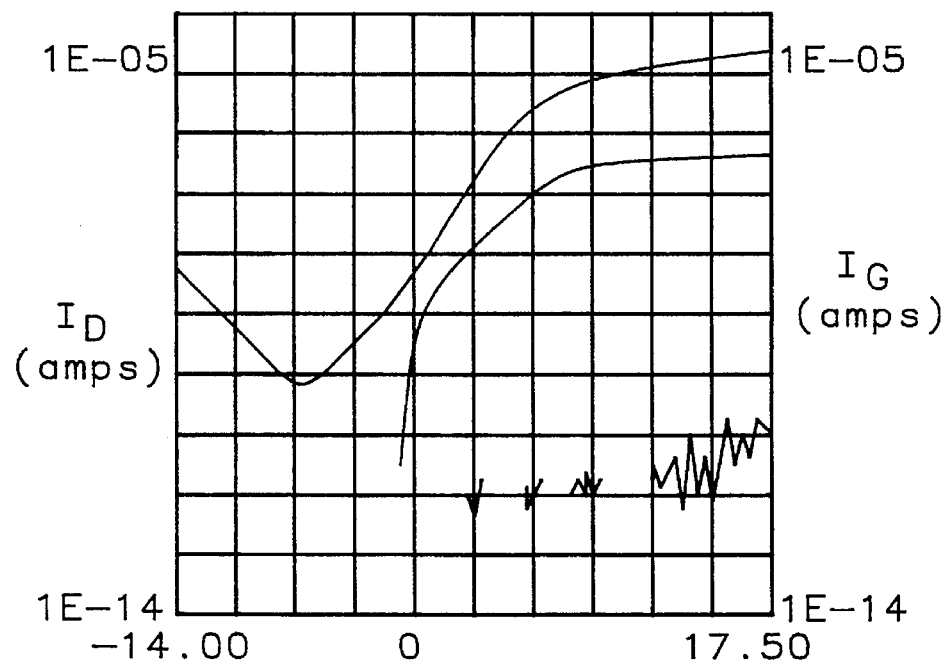
FIG. 7 is a graphical representation of an $I_d$, $V_g$ $V_g$ $V_d$ curve for a transistor of the invention which includes a light-absorbing layer and which was also exposed to a single incidence of laser emission.
Figure 8:
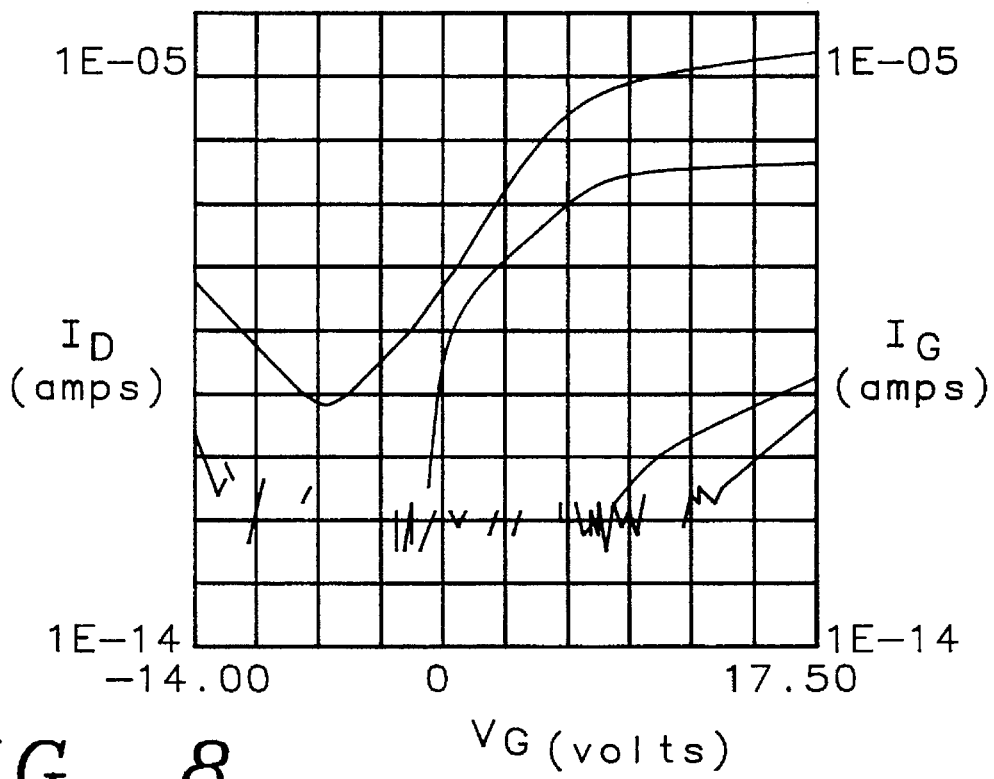
FIG. 8 is a graphical representation of an $V_d$, $I_g$ $V_g$ $V_d$ curve for a transistor of the invention which includes a light-absorbing layer and which was exposed to four incidences of laser emission.
Figure 9:
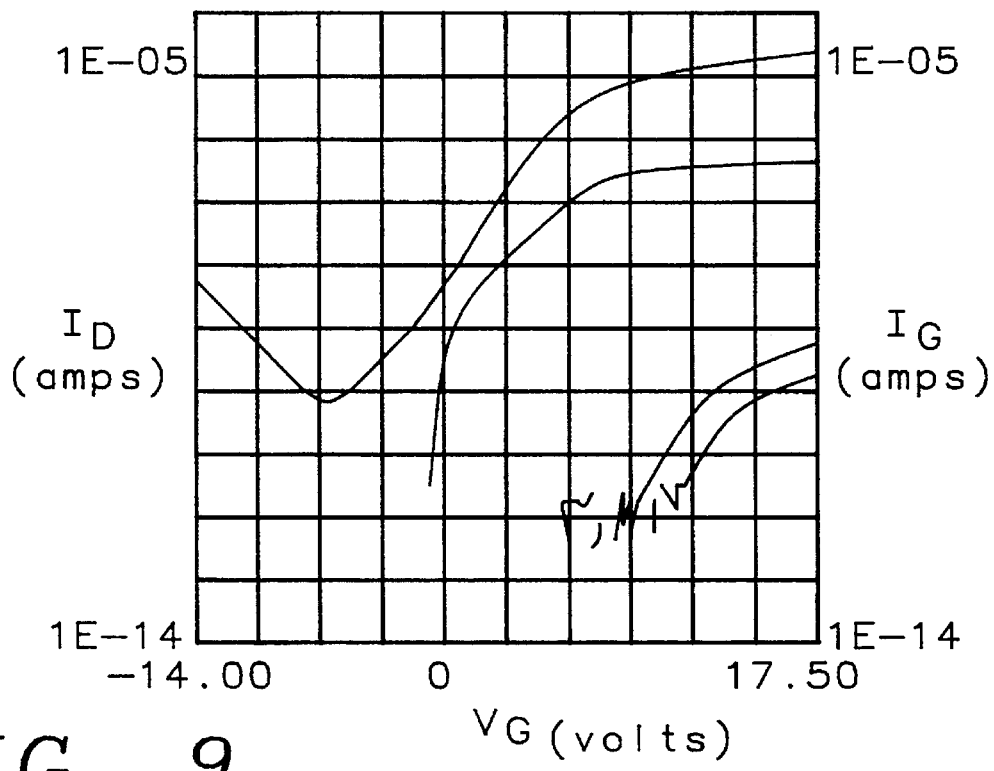
FIG. 9 is a graphical representation of an $V_d$, $I_g$ $V_g$ $V_d$ curve for a transistor of the invention which includes a light-absorbing layer and which was exposed to eight incidences of laser emission.
Figure 10:
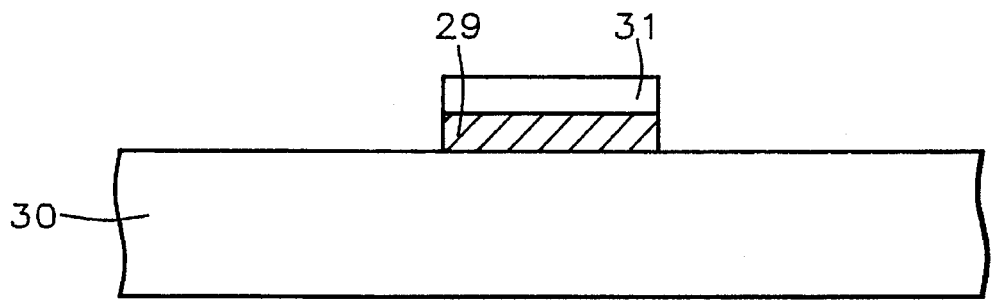
FIGS. 10 through 12 are cross-sectional representations of a method of forming the poly-Si thin film transistor of the invention having a-light-absorbing layer, and forming a fully self-aligned inverted staggered structure.
Figure 11:
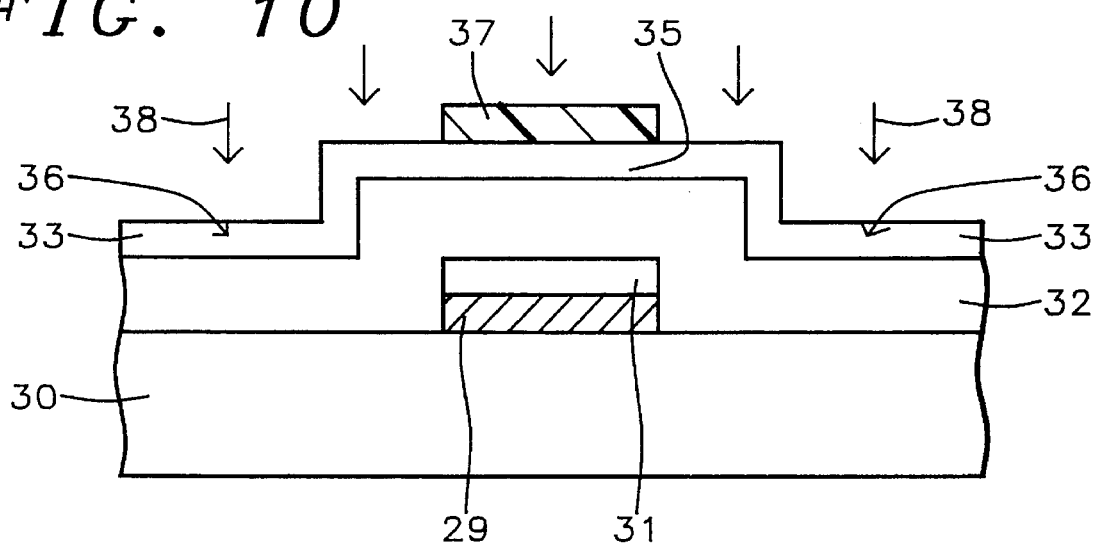
Figure 12:
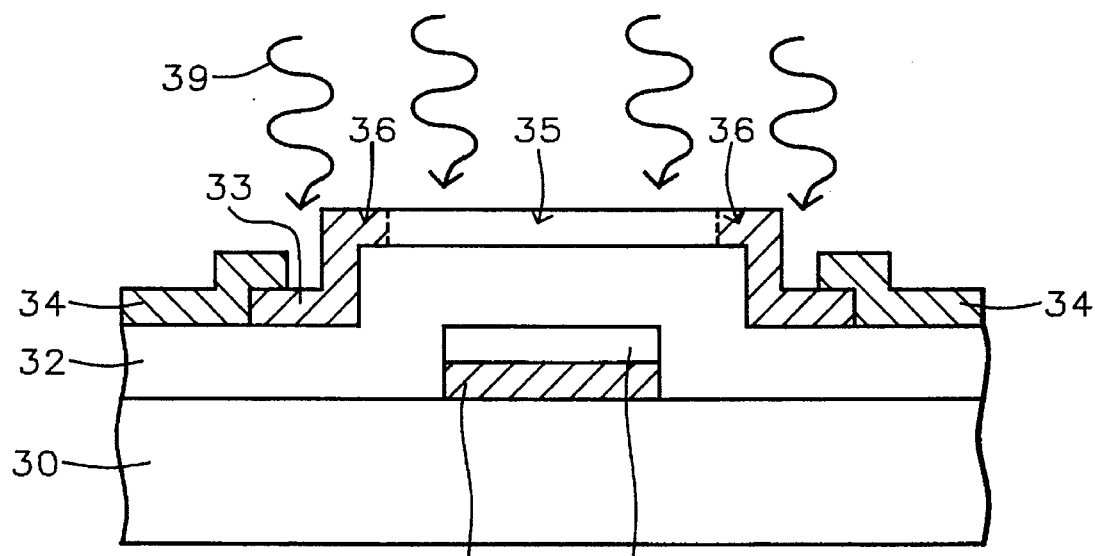

FIGS. 10 through 12 show the steps to manufacture the inventive fully self-aligned inverted staggered type poly-Si thin film transistor having a light-absorbing layer. Metal is first sputtered and then photoetched, as is known in the art, to form a gate electrode 29, having a thickness of between about 1000 and 2500 Angstroms, on the substrate 30. The gate electrode may be formed of Cr (Chromium), Ta (Tantalum), Al (Aluminum) or the like.

In a key step of the invention, the light-absorbing layer 31 is formed on top of the gate electrode 29, as depicted in FIG. 10. The light-absorbing layer 31 may be composed of n+ a-Si, intrinsic a-Si, or any other light-absorbing material and has a thickness of between about 100 and 2000 Angstroms. Deposition of a-Si layer 31 is by PECVD (Plasma Enhanced Chemical Vapor Deposition) through the dissociation of SiH$_4$ (silane) and PH$_3$ (phosphine) at a temperature of about 280° C. and a pressure of about 0.4 torr.

Referring now to FIG. 11, the gate dielectric 32 and the intrinsic a-Si layer 33 are consecutively deposited, by PECVD, through the dissociation of SiH$_4$+N$_2$O, and SiH$_4$, respectively, at a temperature/pressure of about 350° C./0.2 torr and 280° C./0.4 torr, respectively. The gate dielectric layer 32 is preferably formed to a thickness of between about 1000 and 3000 Angstroms. The intrinsic a-Si layer is formed to a thickness of between about 200 and 1000 Angstroms.

A positive photoresist film 37 is then applied uniformly to the a-Si layer 33 by spin-coating, and patterning of the photoresist is performed by back light exposure using the gate metal 29 as the photo mask, for a self-aligned structure. The source and drain contact regions 36 are then formed by ion implant, or ion doping, 38 of phosphorous. Therefore, with this fully self-aligned structure, there is no overlap existing between the source/drain contact areas and the gate electrode.

In another key step of the invention, as depicted in FIG. 12, an excimer laser is applied, for example using 8 laser shots 39 with each shot at about 50 Hz. (hertz) and at an intensity of about 600 mJ/cm.$^2$ in the annealing process after removing the photo resist and the subsequent baking. The laser energy anneals the previously-existing a-Si layer 33 to form the poly-Si layers 35 and 36. Layer 35 represents undoped poly-Si and layer 36 represents doped poly-Si. Layer 34 represents the source and drain electrodes. The laser energy is mostly absorbed by the a-Si layer 33. Because the light-absorbing layer 31 absorbs a portion of the laser energy, it should itself be partially annealed into a mix of a-Si and poly-Si. However, the light-absorbing layers should prevent any reflected laser energy from damaging the gate oxide layer 32, and thus avoid the large gate leakage current.

Figure 13:
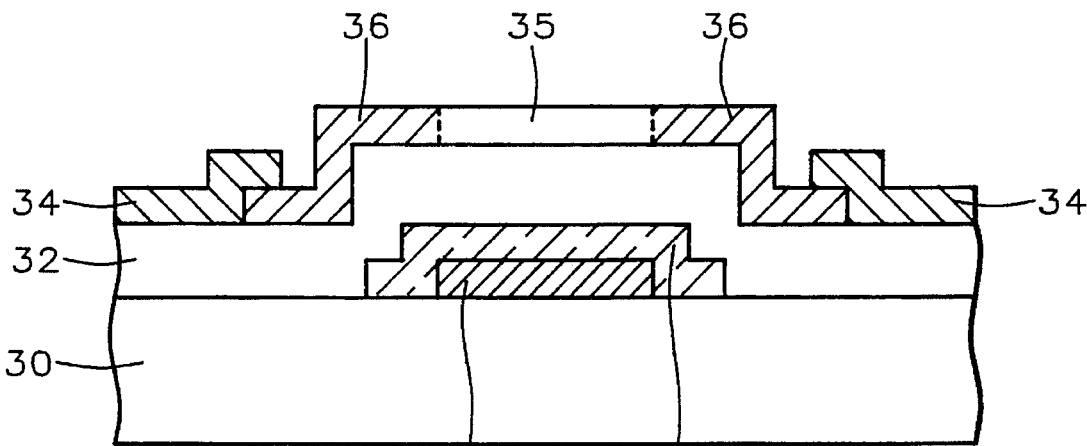
FIG. 13 is a cross-sectional representation of a poly-Si thin film transistor of the invention with a light-absorbing layer etched using a separate mask pattern and not using the gate electrode as the photomask.
Figure 14:
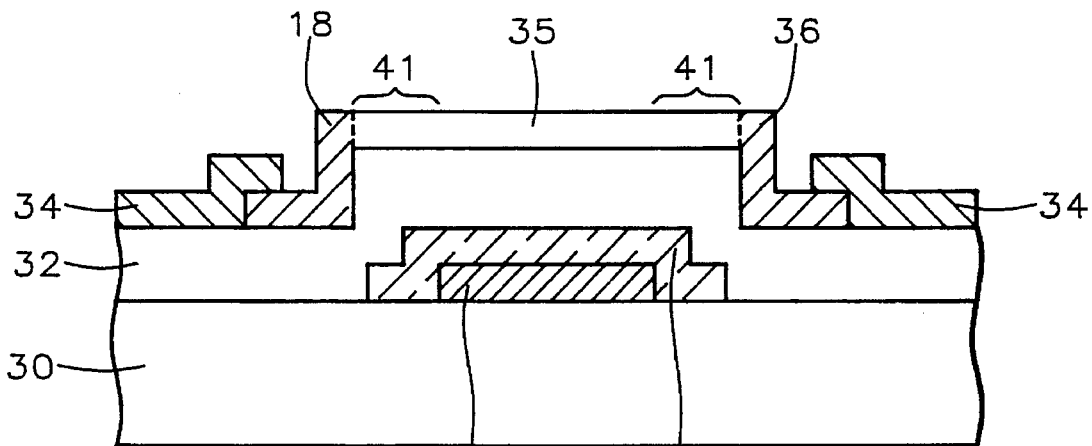
FIG. 14 is a cross-sectional representation of a poly-Si thin film transistor of the invention, wherein the back light exposure of the gate electrode has been modified to form an offset area between the doped poly-Si of the source and drain electrodes and the gate electrode.
Figure 15:
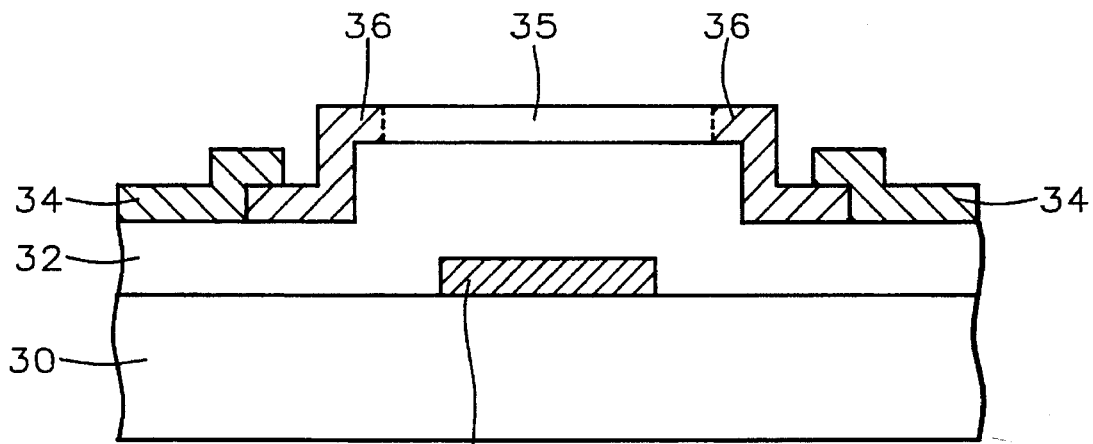
FIG. 15 is a cross-sectional representation of a poly-Si thin film transistor of the invention, wherein the gate electrode is formed not of metal but rather of a light-absorbing conductive material.

FIGS. 13 through 15 show alternative implementations of the present invention's method of manufacture. FIG. 12 shows a thin film transistor in the structure described in the paragraph above, where the light-absorbing layer 31 and the gate electrode 29 are of the same pattern. FIG. 13 shows another possible implementation, wherein a separate mask pattern is used to etch the light absorbing layer (labeled for this description as layer 40) such that the layer covers the sharp edge of the gate electrode, making it possible to pre-etch the light absorbing layer lying at the gate electrode contact opening area.

In this embodiment, there is no need to use laser annealing in the a-si TFT. This is advantageous in the event it is desired to form a-si TFTs and poly-si TFTs on the same substrate. It is very convenient to use the method of a separate mask pattern to remove the light-absorbing layer of the gate electrode of a-si TFT. The back light exposure is decreased to an exposure intensity of about 15 uJ/cm.$^2$ (micro-joules per centimeter squared) and the exposure time is shortened to about 450 seconds, using the absorbing layer as a photomask. Then after ion plasma or ion doping, an offset area 41, as shown in FIG. 14, is formed between the gate metal and the doped poly-si 36. This offset area lowers the I$_{off}$ leakage current. Alternatively, it is also possible to replace the gate electrode with a conductive light-absorbing material (labeled as layer 42 in FIG. 15), such as doped amorphous silicon.

While the invention has been particularly shown and described with reference to the preferred embodiments thereof, it will be understood by those skilled in the art that various changes in form and details may be made without departing from the spirit and scope of the invention.

What is claimed is:

1. A method of manufacturing a self-aligned polysilicon thin film transistor, comprising the steps of:

providing an insulating substrate;

forming a gate electrode on said insulating substrate;

forming a protective light-absorbing layer over said gate electrode and over said insulating substrate;

patterning said protective light-absorbing layer;

forming a gate dielectric layer over said protective light-absorbing layer and over said insulating substrate;

forming a layer of amorphous silicon over said gate dielectric layer;

forming a photoresist mask over said layer of amorphous silicon, aligned with said protective light-absorbing layer;

implanting said amorphous silicon layer with a conductivity-imparting dopant in source/drain regions not protected by said photoresist mask;

removing said photoresist mask;

laser-annealing said amorphous silicon layer, whereby doped polysilicon is formed in said source/drain regions, and undoped polysilicon is formed in areas between said source/drain regions; and forming source and drain electrodes of electrically conductive material in contact with said source/drain regions.

2. The method of claim 1 wherein said protective light-absorbing layer is formed of amorphous silicon.

3. The method of claim 2 wherein said amorphous silicon is intrinsic amorphous silicon.

4. The method of claim 2 wherein said amorphous silicon is doped amorphous silicon.

5. The method of claim 1 wherein said patterning said protective light-absorbing layer is performed such that the edges of said protective light-absorbing layer are aligned with the edges of said gate electrode.

6. The method of claim 1 wherein said patterning said protective light-absorbing layer is performed such that the edges of said protective light-absorbing layer are over said insulating substrate and offset a distance D from the edges of said gate electrode.

7. The method of claim 6 wherein said source/drain regions are horizontally offset from said gate electrode by said distance D.

8. The method of claim 1 wherein said forming said photoresist mask comprises the steps of:

forming a positive photoresist layer over said layer of amorphous silicon, by spin coating;

exposing said positive photoresist layer to a back-light exposure of light, except in areas masked by said protective light-absorbing layer; and developing said positive photoresist layer to remove said photoresist in areas exposed to said back-light exposure.

9. The method of claim 8 wherein said laser-annealing is performed with a pulsed excimer laser.

10. The method of claim 1 wherein a plurality of said self-aligned polysilicon thin film transistor are formed in the peripheral region of a liquid crystal display (LCD) simultaneously with the formation of amorphous silicon thin film transistors to be used as switching elements for said display.

11. A method of manufacturing a self-aligned polysilicon thin film transistor, comprising the steps of:

providing an insulating substrate;

forming a gate electrode of a conductive light-absorbing material on said insulating substrate;

forming a gate dielectric layer over said gate electrode and over said insulating substrate;

forming a layer of amorphous silicon over said gate dielectric layer;

forming a photoresist mask over said layer of amorphous silicon, aligned with said gate electrode;

implanting said amorphous silicon layer with a conductivity-imparting dopant in source/drain regions not protected by said photoresist mask;

removing said photoresist mask; laser-annealing said amorphous silicon layer, whereby doped polysilicon is formed in said source/drain regions, and undoped polysilicon is formed in areas between said source/drain regions; and forming source and drain electrodes of electrically conductive material in contact with said source/drain regions.

12. The method of claim 11 wherein said conductive light-absorbing material is doped amorphous silicon.

13. The method of claim 11 wherein said forming said photoresist mask comprises the steps of:

forming a positive photoresist layer over said layer of amorphous silicon, by spin coating;

exposing said positive photoresist layer to a back-light exposure of light, except in areas masked by said gate electrode; and developing said positive photoresist layer to remove said photoresist in areas exposed to said back-light exposure.

* * * * *